(12) United States Patent
Banba et al.

(10) Patent No.: US 6,406,774 B1
(45) Date of Patent: *Jun. 18, 2002

(54) ELECTRICALLY CONDUCTIVE COMPOSITION FOR USE IN THROUGH HOLE OF ELECTRIC COMPONENT

(75) Inventors: Shinichiro Banba, Komatsu; Hiroji Tani, Nagaokakyo, both of (JP)

(73) Assignee: Murata Manufacturing Co. Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/127,945

(22) Filed: Jul. 31, 1998

Related U.S. Application Data

(62) Division of application No. 08/895,357, filed on Jul. 16, 1997, now abandoned.

(30) Foreign Application Priority Data

Jul. 16, 1996 (JP) .............................................. 8-186345
Jun. 25, 1997 (JP) .............................................. 9-168975

(51) Int. Cl.⁷ .............................. B32B 3/24; H05K 7/08
(52) U.S. Cl. ....................... 428/139; 428/131; 428/901; 29/852; 29/853; 252/512; 252/513; 252/514; 252/515; 361/779; 174/262; 174/263; 174/264; 174/265

(58) Field of Search ................................ 428/131, 139, 428/901; 361/779; 29/852, 853; 252/512, 513, 514, 515; 174/262, 263, 264, 265; 427/97

(56) References Cited

U.S. PATENT DOCUMENTS

| | | | | |
|---|---|---|---|---|
| 4,371,459 A | * | 2/1983 | Nazarenko | 252/514 |
| 4,414,143 A | * | 11/1983 | Felten | 252/514 |
| 5,336,444 A | * | 8/1994 | Casey et al. | 252/513 |
| 5,506,058 A | * | 4/1996 | Ikuina et al. | 428/426 |

FOREIGN PATENT DOCUMENTS

| | | |
|---|---|---|
| JP | 59-124706 | 7/1984 |
| JP | 4-289608 | 10/1992 |
| JP | 7-307110 | 11/1995 |
| JP | 9-35530 | 2/1997 |

* cited by examiner

*Primary Examiner*—William P. Watkins, III
(74) *Attorney, Agent, or Firm*—Dickstein, Shapiro, Morin & Oshinsky, LLP

(57) ABSTRACT

The invention provides an electrically conductive composition for use in a through hole of an electric component, comprising a noble metal powder, a base metal powder and an organic vehicle, the amount of the base metal to 100 parts by weight of the noble metal is about 1 to 95 parts by weight. The composition provides baked electrodes free from structural defects, such as a discontinuity or separation due to shrinkage on calcination.

6 Claims, 3 Drawing Sheets

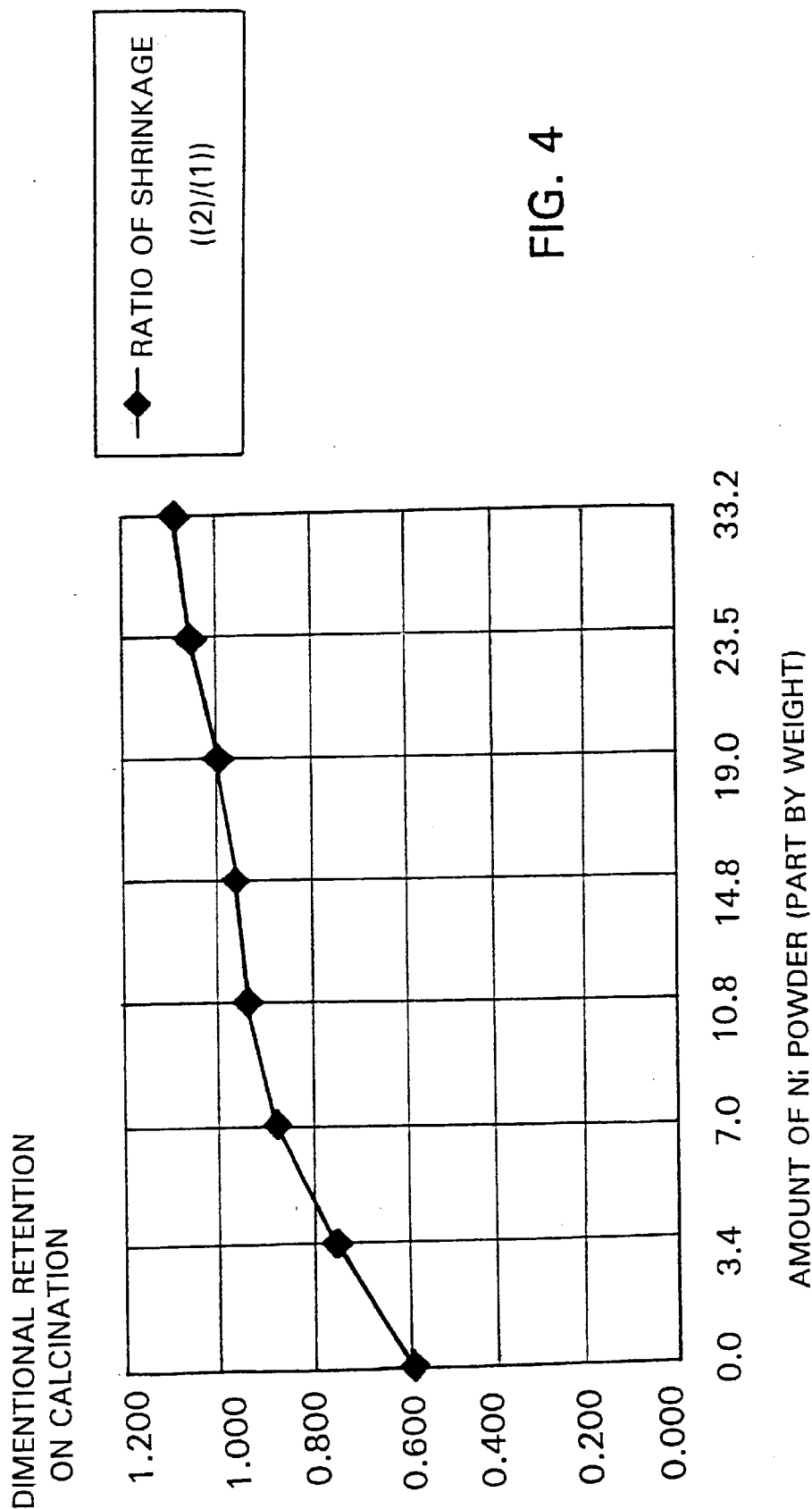

000# ELECTRICALLY CONDUCTIVE COMPOSITION FOR USE IN THROUGH HOLE OF ELECTRIC COMPONENT

This is a division of application Ser. No. 08/895,357, filed Jul. 16, 1997 ABN.

BACKGROUND OF THE INVENTION

1. Field of the Invention

This invention relates to an electrically conductive composition for use in a through hole of an electric component.

2. Description of the Related Art

As shown in the cross sectional view of FIG. 1A, electrical connection through through-holes of a ceramic substrate 1 has been established by applying an electrically conductive composition comprising a conductive material, such as Ag—Pd or Ag—Pt, to the through-hole 2, usually having a diameter of 0.3 to 0.5 mm, which are made by means of a mold or a laser beam, by screen printing, followed by calcination to form a thick-film conductor 3 on the inner wall of the through-hole 2.

With the recent tendency to size reduction and density increase in electronic equipment, the diameter of through-holes has been made as small as about 0.1 mm, and accordingly, the above-described method for electrical connection is now being replaced with a method of filling the through-hole 2 with a conductive composition as shown in FIG. 1B.

However, when a conventional conductive composition used in electronic components is put into through-holes of about 0.1 mm in diameter and calcined, the resulting conductor tends to suffer from a discontinuity as shown in FIG. 2A or separation from the inner wall as shown in FIG. 2B due to shrinkage on calcination, resulting in poor electrical reliability of the through-holes.

SUMMARY OF THE INVENTION

An object of the present invention is to prevent structural defects of electrodes, such as a discontinuity or separation of electrodes, and to provide an electrically conductive composition for use in a through hole of a electric component effective in improving electrical reliability of electrodes.

The invention provides an electrically conductive composition for use in a through hole of an electric component comprising an organic vehicle and a combination of base metal and another metal selected from the group consisting of noble metal, anti-oxidation finished base metal and Al, and the amount of the base metal to 100 parts by weight of the noble metal is about 1 to 95 parts by weight.

The above conductive composition may further comprise glass frit.

In the above electrically conductive composition, the glass frit may be lead borosilicate-based glass, zinc borosilicate-based glass or barium borosilicate-based glass.

In the above conductive composition, the member of the group may be noble metal, preferably silver or gold.

In the above conductive composition, the base metal may be copper, nickel, cobalt, tungsten or manganese. Preferably, the base metal is copper or nickel.

In the above electically conductive composition, the base metal may be copper, the member of the group may be the noble metal, and the amount of the copper to 100 parts by weight of the noble metal may be about 35 to 95 parts by weight.

In the above electically conductive composition, the base metal may be nickel, the member of the group may be the noble metal, and the amount of the nickel to 100 parts by weight of the noble metal may be about 10 to 25 parts by weight.

The electically conductive composition may further comprise platinum powder of palladium powder.

In the above electically conductive composition, the member of the group may be the noble metal, the electrically conductive composition may further comprise platinum powder, and the amount of said platinum powder to 100 parts by weight of the noble metal may be about 0.2 to 0.8 parts by weight.

The conductive composition according to the present invention provides electrodes in through holes of electric components which are free from structural defects, such as a discontinuity and separation, and secure improved electrical reliability.

Where a noble metal powder alone is used as a conductive powder forming an electrode, the electrode obtained after calcination is thinner than in its green state before calcination due to calcination shrinkage. This volume shrinkage causes a discontinuity or separation of the electrode. A base metal powder added to the noble metal powder undergoes oxidation on calcination (baking), resulting in volume expansion called oxidative expansion. That is, the oxidative expansion of the base metal powder compensates for the calcination shrinkage of the noble metal powder so that the reduction in volume after baking can be prevented. It is also possible to increase the volume after baking over that before baking. Accordingly, the present invention makes it possible to maintain the electrical connection sufficiently after calcination.

Since the base metal powder of the conductive composition should undergo oxidative expansion on calcination in formation of baked electrodes, calcination is preferably carried out in a non-reducing atmosphere, e.g., air, which is another advantage of the present invention.

The reason for limiting the amount of the base metal and the another metal is that if the amount of the base metal to 100 parts of the another metal exceeds 95 parts by weight, the resistivity of the conductive composition would become extremely large. For some uses, the loss of volume by shrinkage of a noble metal powder does not need to be filled up completely by a base metal powder. In other words, addition of a base metal powder to such an extent as to prevent occurrence of an electrode discontinuity or separation suffices for the object of the present invention.

Where, as in the present invention, an electrode comprising a noble metal powder as a primary component and a base metal powder as a secondary component is to be formed, it is preferable that the amount of the base metal to 100 parts by weight of the noble metal is about 1 to 95 parts by weight. If the proportion of the base metal powder exceeds about 95 parts by weight, the resulting conductor tends to have an extremely increased resistivity. Preferably, the base metal undergoes oxidative expansion on calcination and the amount is such that the the ratio ("dimensional retention") of the electrode thickness after calcination to the dry thickness before calcination is not lower than about 0.6, and more preferably not lower than 0.85.

Examples of the noble metal which can be used in the present invention include silver and gold. Silver is preferred from the standpoint of low resistance of the resulting conductor, ease of calcination, and the material cost. It is possible to substitute a powder of anti-oxidation finished copper, nickel, etc. for the noble metal powder. These powders, while not a noble metal, function similarly to a noble metal powder. It is also possible to use aluminum, about not being a noble metal.

Examples of the base metals which can be used in the present invention include copper, nickel, cobalt, tungsten and manganese, with copper and nickel being preferred. Copper is preferred for its ease of oxidation, its high melting point (being hardly reactive with a noble metal powder) and the material cost. Nickel is preferred for the same reasons. Both copper and nickel can be used.

When copper is used as the base metal and the nobel metal metal is used as the another metal, it is preferable that the amount of the copper to 100 parts by weight of the nobel metal is about 35 to 95 parts by weight, taking into account of a shrinkage ratio after calcination of a through-hole. When nickel is used instead of copper, the preferable amount of the nickel is about 10 to 25 parts by weight.

Copper powder, used as a base metal powder, preferably has an average particle size of not greater than about 10 micrometer. Coarse copper particles having an average particle size exceeding about 10 micrometer tend to clog through-holes, causing a conductive composition-starved state. The above-specified preferred particle size range also applies to nickel powder for the same reason.

Conventional organic vehicles can be used in the practice of this invention. Examples include acrylic resin, ethyl cellulose resin, alkyd resin, etc. dissolved in a high-melting solvent such as α-terpineol and the like.

If desired, the conductive composition of the present invention may contain glass frit. The conductive composition containing glass frit is effectively applicable where electrodes and the substrate are not calcined simultaneously. Where electrodes and a substrate are formed by simultaneous calcination, the powder may undergo chemical reaction with the material of the substrate to form a chemical bond so that addition of glass frits is not always necessary. Otherwise, glass bonding is required for adhesion to the substrate. Therefore, in such cases, it is recommended to use glass frit having satisfactory adhesion strength.

Examples of useful glass frits include lead borosilicate-based glass, zinc borosilicate-based glass, bismuth borosilicate-based glass, and barium borosilicate-based glass.

The conductive composition of the present invention may further contain platinum powder or palladium powder for prevention of migration of the electrode material. In this case, platinum or palladium powder is preferably used in an amount of about 1 to 30% by weight based on the total weight of the noble metal powder, the base metal powder, glass frit (if used) and the platinum or palladium powder. If the amount exceeds about 30% by weight, the resistivity of the resulting conductor increases undesirably.

Because of the above-mentioned characteristics, the conductive composition according to the present invention is preferably used as a conductor filling through-holes or via-holes of a substrate for an electronic component. Accordingly, preferred applications of the electronic component of the present invention are multilayer ceramic substrates and hybrid IC.

According to the present invention, there is provided an electrically conductive composition which maintains electrical connection even after calcination to thereby provide baked electrodes free from structural defects, such as a discontinuity and separation, thereby securing improved electrical reliability of the electrodes.

The present invention will now be illustrated in greater detail with reference to Examples, but it should be understood that the present invention is not construed as being limited thereto.

BRIEF DESCRIPTION OF THE DRAWINGS

FIG. 4 is a graph showing the relationship between Ni powder content vs. ratio of thickness after calcination/dry thickness.

PREFERRED EMBODIMENT OF THE PRESENT INVENTION

EXAMPLE 1

Figure 1A:
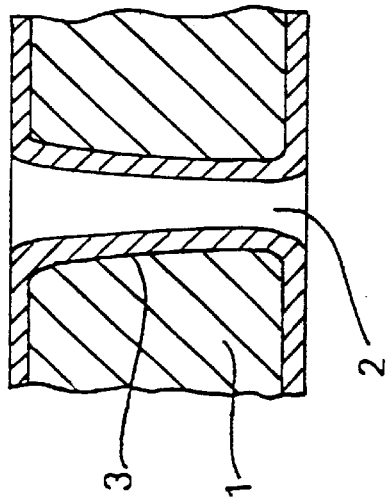
FIGS. 1A and 1B show cross sections of a through-hole of a ceramic substrate.
Figure 1B:
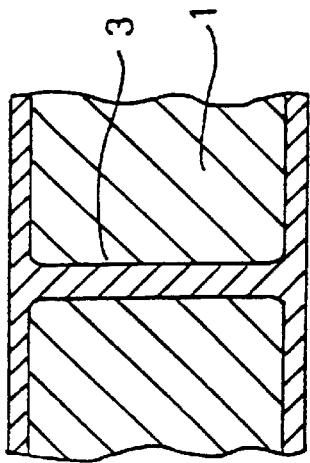
Figure 2A:
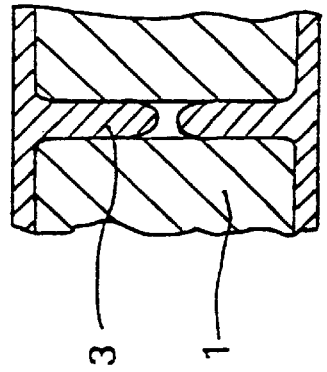
FIGS. 2A and 2B show cross sections of a defective through-hole of a ceramic substrate.
Figure 2B:
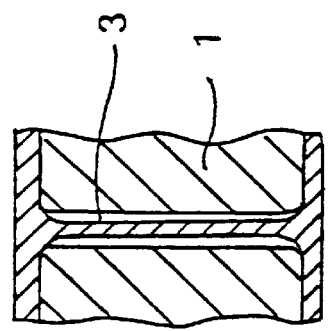

Silver powder having an average particle size of 3 micrometer, platinum powder, and copper powder having an average particle size of 5 micrometer or 10 micrometer were prepared as material of a conductive composition. $Pb_3O_4$, $SiO_2$, $H_3BO_3$ and ZnO were mixed, melted at a high temperature, and quenched to obtain a glass, which was then ground to prepare a glass frit having the composition of $PbO$—$SiO_2$—$B_2O_3$—$ZnO$.

These materials and an organic vehicle were mixed at the ratios shown in Table 1 below. An acrylic resin dissolved in α-terpineol was used here as an organic vehicle to prepare a conductive composition. Ethyl cellulose resin, alkyd resin, etc. dissolved in a high-melting solvent may also be used as the organic vehicle.

TABLE 1

| Sample No. | Average particle diameter of Ag Powder | Amount of Ag Powder | | Average Particle Diameter of Cu Powder | Amount of Cu Powder | | Amount of Glass Frit | | Amount of Pt Powder | | Amount of Organic vehicle | |
|---|---|---|---|---|---|---|---|---|---|---|---|---|
| | | wt % | parts | | wt % | Parts | wt % | Parts | wt % | Parts | wt % | Parts |
| 1 | 3 | 71.0 | 100.0 | 5 | 0.0 | 0.0 | 9.5 | 13.3 | 0 | 0 | 19.5 | 27.4 |
| 2 | 3 | 64.0 | 100.0 | 5 | 10.0 | 15.6 | 8.5 | 13.3 | 0 | 0 | 17.5 | 27.4 |
| 3 | 3 | 56.8 | 100.0 | 5 | 20.0 | 35.2 | 7.6 | 13.3 | 0 | 0 | 15.6 | 27.4 |
| 4 | 3 | 53.3 | 100.0 | 5 | 25.0 | 46.9 | 7.1 | 13.3 | 0 | 0 | 14.6 | 27.4 |
| 5 | 3 | 49.8 | 100.0 | 5 | 30.0 | 60.3 | 6.6 | 13.3 | 0 | 0 | 13.6 | 27.4 |

TABLE 1-continued

| | | | | | | | | | | | | |
|---|---|---|---|---|---|---|---|---|---|---|---|---|
| 6 | 3 | 42.6 | 100.0 | 5 | 40.0 | 93.8 | 5.7 | 13.3 | 0 | 0 | 11.7 | 27.4 |
| 7 | 3 | 71.0 | 100.0 | 10 | 0.0 | 0.0 | 9.5 | 13.3 | 0 | 0 | 19.5 | 27.4 |
| 8 | 3 | 64.0 | 100.0 | 10 | 10.0 | 15.6 | 8.5 | 13.3 | 0 | 0 | 17.5 | 27.4 |
| 9 | 3 | 56.8 | 100.0 | 10 | 20.0 | 35.2 | 7.6 | 13.3 | 0 | 0 | 15.6 | 27.4 |
| 10 | 3 | 53.3 | 100.0 | 10 | 25.0 | 46.9 | 7.1 | 13.3 | 0 | 0 | 14.6 | 27.4 |
| 11 | 3 | 49.8 | 100.0 | 10 | 30.0 | 60.3 | 6.6 | 13.3 | 0 | 0 | 13.6 | 27.4 |
| 12 | 3 | 42.6 | 100.0 | 10 | 40.0 | 93.8 | 5.7 | 13.3 | 0 | 0 | 11.7 | 27.4 |
| 13 | 3 | 70.4 | 100.0 | 5 | 0.0 | 0.0 | 9.5 | 13.4 | 0.6 | 0.9 | 19.5 | 27.7 |
| 14 | 3 | 63.4 | 100.0 | 5 | 10.0 | 15.8 | 8.5 | 13.4 | 0.6 | 0.9 | 17.5 | 27.7 |
| 15 | 3 | 56.3 | 100.0 | 5 | 20.0 | 35.5 | 7.6 | 13.4 | 0.5 | 0.9 | 15.6 | 27.7 |
| 16 | 3 | 52.8 | 100.0 | 5 | 25.0 | 47.3 | 7.1 | 13.4 | 0.5 | 0.9 | 14.6 | 27.7 |
| 17 | 3 | 49.3 | 100.0 | 5 | 30.0 | 60.9 | 6.6 | 13.4 | 0.5 | 0.9 | 13.6 | 27.7 |
| 18 | 3 | 42.2 | 100.0 | 5 | 40.0 | 94.7 | 5.7 | 13.4 | 0.4 | 0.9 | 11.7 | 27.7 |
| 19 | 3 | 70.4 | 100.0 | 10 | 0.0 | 0.0 | 9.5 | 13.4 | 0.6 | 0.9 | 19.5 | 27.7 |
| 20 | 3 | 63.4 | 100.0 | 10 | 10.0 | 15.8 | 8.5 | 13.4 | 0.6 | 0.9 | 17.5 | 27.7 |
| 21 | 3 | 56.3 | 100.0 | 10 | 20.0 | 35.5 | 7.6 | 13.4 | 0.5 | 0.9 | 15.6 | 27.7 |
| 22 | 3 | 52.8 | 100.0 | 10 | 25.0 | 47.3 | 7.1 | 13.4 | 0.5 | 0.9 | 14.6 | 27.7 |
| 23 | 3 | 49.3 | 100.0 | 10 | 30.0 | 60.9 | 6.6 | 13.4 | 0.5 | 0.9 | 13.6 | 27.7 |
| 24 | 3 | 42.2 | 100.0 | 10 | 40.0 | 94.7 | 5.7 | 13.4 | 0.4 | 0.9 | 11.7 | 27.7 |

| Sample No. | Dry Thickness (1) (micrometer) | Thickness After Calcination (2) (micrometer) | Dimentional retention ((2)/(1)) | Sheet Resistivity (mΩ/□) |
|---|---|---|---|---|
| 1 | 21.4 | 12.6 | 0.590 | 2.5 |
| 2 | 24.5 | 17.6 | 0.720 | 2.7 |
| 3 | 22.0 | 19.8 | 0.900 | 3.1 |
| 4 | 22.5 | 22.1 | 0.980 | 3.7 |
| 5 | 22.3 | 23.0 | 1.030 | 4.5 |
| 6 | 23.1 | 24.5 | 1.060 | 6.5 |
| 7 | 25.1 | 14.8 | 0.590 | 2.4 |
| 8 | 24.3 | 18.0 | 0.740 | 3.1 |
| 9 | 22.9 | 21.1 | 0.920 | 4.1 |
| 10 | 23.1 | 23.1 | 1.000 | 4.9 |
| 11 | 23.0 | 24.6 | 1.070 | 5.6 |
| 12 | 22.7 | 25.0 | 1.100 | 7.3 |
| 13 | — | — | — | — |
| 14 | — | — | — | — |
| 15 | — | — | — | — |
| 16 | — | — | — | — |
| 17 | — | — | — | — |
| 18 | — | — | — | — |
| 19 | — | — | — | — |
| 20 | — | — | — | — |
| 21 | — | — | — | — |
| 22 | — | — | — | — |
| 23 | — | — | — | — |
| 24 | — | — | — | — |

The resulting conductive composition was applied to a previously prepared 0.63 mm thick aluminum substrate having through-holes of 0.1 mm in diameter to coat the surface of the substrate and to fill the through-holes with the conductive composition. After drying, the aluminum substrate with the conductive composition was calcined at 850° C. in air for 60 minutes.

The thickness of the coating layer on the substrate was measured after drying and after calcination to obtain the ratio of shrinkage on calcination in terms of the ratio of the thickness after calcination to the dry thickness. The surface resistivity of the conductor formed in the through-hole was measured.

Table 1 shows the dry thickness (1) (micrometer), the thickness after calcination (2) (micrometer), the ratio of shrinkage ((2)/(1)), and the surface resistivity (mΩ). The sheet resistivity (mΩ/□) was calculated from equation: $R = RS \times L/W$ (RS: sheet resistivity; L: length of a resistor; W: width of a resistor).

Figure 3:
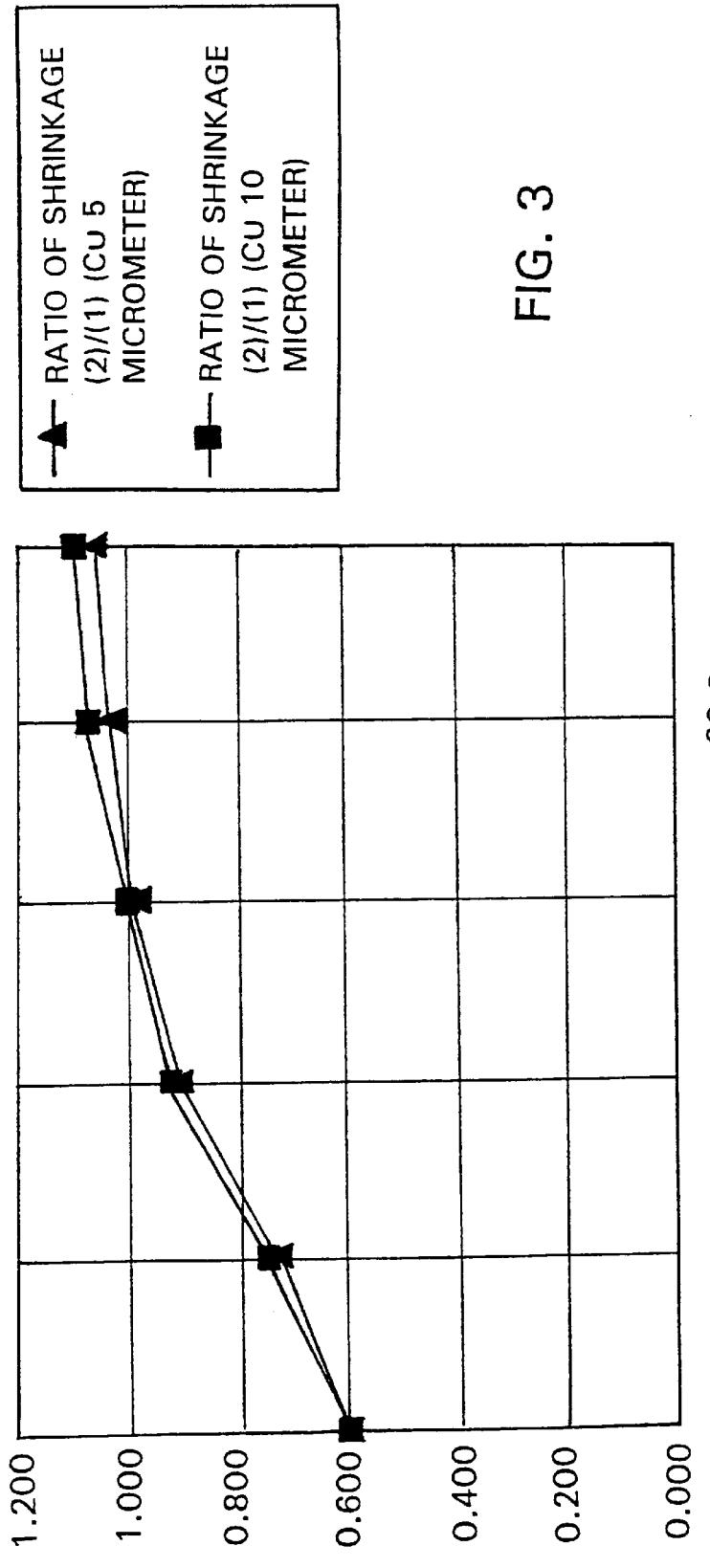
FIG. 3 is a graph showing the relationship between Cu powder content vs. ratio of thickness after calcination/dry thickness.

The results of Table 1 were plotted in FIG. 3 to show the relationship between the amount of Cu powder and the shrinkage ratio taking the amount of Cu powder as a parameter.

EXAMPLE 2

Silver powder having an average particle size of 3 micrometer, platinum powder, and nickel powder having an average particle size of 0.5 micrometer were prepared as material of a conductive composition. $Pb_3O_4$, $SiO_2$, $H_3BO_3$, and ZnO were mixed, melted at a high temperature, and quenched to obtain a glass, which was then ground to prepare a glass frit having a composition of PbO—$SiO_2$—$B_2O_3$—ZnO.

These materials were mixed with an organic vehicle at the ratios shown in Table 2. An acrylic resin dissolved in α-terpineol was used here as an organic vehicle to prepare a conductive composition.

TABLE 2

| Sample No. | Average Particle Diameter of Ag Powder (micrometer) | Amount of Ag Powder wt % | Amount of Ag Powder Part by weight | Average Particle Diameter of Ni Powder (micrometer) | Amount of Ni Powder wt % | Amount of Ni Powder Part by weight | Amount of Glass Frit wt % | Amount of Glass Frit Part by weight | Amount of Pt Powder wt % | Amount of Pt Powder Part by weight | Amount of Organic vehicle wt % | Amount of Organic vehicle Part by weight |
|---|---|---|---|---|---|---|---|---|---|---|---|---|
| 1 | 3 | 75.2 | 100.0 | 0.5 | 0.0 | 0.0 | 8.1 | 10.8 | 0 | 0 | 16.7 | 22.2 |
| 2 | 3 | 73.3 | 100.0 | 0.5 | 2.5 | 3.4 | 7.9 | 10.8 | 0 | 0 | 16.3 | 22.2 |
| 3 | 3 | 71.4 | 100.0 | 0.5 | 5.0 | 7.0 | 7.7 | 10.8 | 0 | 0 | 15.9 | 22.2 |
| 4 | 3 | 69.6 | 100.0 | 0.5 | 7.5 | 10.8 | 7.5 | 10.8 | 0 | 0 | 15.4 | 22.2 |
| 5 | 3 | 67.7 | 100.0 | 0.5 | 10.0 | 14.8 | 7.3 | 10.8 | 0 | 0 | 15.0 | 22.2 |
| 6 | 3 | 65.8 | 100.0 | 0.5 | 12.5 | 19.0 | 7.1 | 10.8 | 0 | 0 | 14.6 | 22.2 |
| 7 | 3 | 63.9 | 100.0 | 0.5 | 15.0 | 23.5 | 6.9 | 10.8 | 0 | 0 | 14.2 | 22.2 |
| 8 | 3 | 60.2 | 100.0 | 0.5 | 20.0 | 33.2 | 6.5 | 10.8 | 0 | 0 | 13.3 | 22.2 |
| 9 | 3 | 74.6 | 100.0 | 0.5 | 0.0 | 0.0 | 8.1 | 10.9 | 0.6 | 0.8 | 16.7 | 22.4 |
| 10 | 3 | 72.8 | 100.0 | 0.5 | 2.5 | 3.4 | 7.9 | 10.9 | 0.5 | 0.8 | 16.3 | 22.4 |
| 11 | 3 | 70.9 | 100.0 | 0.5 | 5.0 | 7.1 | 7.7 | 10.9 | 0.5 | 0.8 | 15.9 | 22.4 |
| 12 | 3 | 69.0 | 100.0 | 0.5 | 7.5 | 10.9 | 7.5 | 10.9 | 0.5 | 0.8 | 15.5 | 22.4 |
| 13 | 3 | 67.2 | 100.0 | 0.5 | 10.0 | 14.9 | 7.3 | 10.9 | 0.5 | 0.8 | 15.0 | 22.4 |
| 14 | 3 | 65.3 | 100.0 | 0.5 | 12.5 | 19.1 | 7.1 | 10.9 | 0.5 | 0.8 | 14.6 | 22.4 |
| 15 | 3 | 63.4 | 100.0 | 0.5 | 15.0 | 23.6 | 6.9 | 10.9 | 0.5 | 0.8 | 14.2 | 22.4 |
| 16 | 3 | 59.7 | 100.0 | 0.5 | 20.0 | 33.5 | 6.5 | 10.9 | 0.4 | 0.8 | 13.4 | 22.4 |

| Sample No. | Dry Thickness (1) (micrometer) | Thickness after Calcination (2) (micrometer) | Dimentional retention ((2)/(1)) | Sheet Resistivity (mΩ/□) |
|---|---|---|---|---|
| 1 | 22.9 | 13.4 | 0.585 | 1.4 |
| 2 | 24.8 | 18.5 | 0.746 | 1.9 |
| 3 | 22.3 | 19.6 | 0.879 | 2.4 |
| 4 | 25.0 | 23.3 | 0.932 | 2.6 |
| 5 | 25.1 | 24.2 | 0.964 | 3.6 |
| 6 | 25.4 | 25.2 | 0.992 | 3.7 |
| 7 | 23.2 | 24.6 | 1.060 | 3.9 |
| 8 | 21.8 | 23.7 | 1.090 | 4.1 |
| 9 | — | — | — | — |
| 10 | — | — | — | — |
| 11 | — | — | — | — |
| 12 | — | — | — | — |
| 13 | — | — | — | — |
| 14 | — | — | — | — |
| 15 | — | — | — | — |
| 16 | — | — | — | — |

The resulting conductive composition was applied to a previously prepared 0.63 mm thick aluminum substrate having through-holes of 0.1 mm in diameter to coat the surface of the substrate and to fill the through-holes with the conductive composition. After drying, the aluminum substrate was calcined at 850° C. in air for 60 minutes.

The thickness of the coating layer on the substrate was measured after drying and after calcination to obtain the ratio of shrinkage on calcination in terms of the ratio of the thickness after calcination to the dry thickness. The sheet resistivity of the conductor formed in the through-hole was measured.

Table 2 shows the dry thickness (1) (micrometer), the thickness after calcination (2) (micrometer), the ratio of shrinkage ((2)/(1)), and the sheet resistivity (mΩ/□). The sheet resistivity (mΩ/□) was calculated from equation: $R = RS \times L/W$ (RS: sheet resistivity; L: length of a resistor; W: width of a resistor).

The results in Table 2 were plotted in FIG. 4 to show the relationship between the amount of Ni powder and the shrinkage ratio.

While the invention has been described in detail and with reference to specific examples thereof, it will be apparent to one skilled in the art that various changes and modifications can be made therein without departing from the spirit and scope thereof.

What is claimed is:

1. An electric component comprising:
   an aluminum substrate having a through hole formed therein and an electrically conductive composition in the through hole suitable for being calcined in a non-reducing atmosphere and comprising:
   an organic vehicle and a combination of silver and nickel, and
   the amount of the nickel to 100 parts by weight of the silver is about 10 to 25 parts by weight,
   whereby the oxidation of the nickel upon calcining would result in a volume expansion sufficient to compensate for the volume contraction of the silver during said calcining.

2. A method of avoiding the adverse effects from separation and discontinuity when forming an electrode in a through hole of an electric component comprising an aluminum substrate by applying heat in a non-reducing atmosphere to said component having an electrically conductive composition in said through hole which comprises employing an organic vehicle and a combination of silver and nickel, the amount of the nickel to 100 parts by weight of the silver being about 10 to 25 parts by weight, as said composition, whereby the oxidation of the nickel upon calcining would result in a volume expansion sufficient to compensate for the volume contraction of the silver during said calcining.

3. A method according to claim 2, wherein the electrically conductive composition further comprises glass frit.

4. An electric component according to claim 1, wherein the electrically conductive composition further comprises glass frit.

5. An electric component according to claim 4, wherein said glass frit is lead borosilicate-based glass, zinc borosilicate-based glass or barium borosilicate-based glass.

6. A method according to claim 3, wherein said glass frit is lead borosilicate-based glass, zinc borosilicate-based glass or barium borosilicate-based glass.

* * * * *